United States Patent [19]

Iwasa

[11] Patent Number: 4,724,040

[45] Date of Patent: Feb. 9, 1988

[54] METHOD FOR PRODUCING ELECTRIC CIRCUITS ON A BASE BOAD

[75] Inventor: Yamahiro Iwasa, Hachioji, Japan

[73] Assignee: Asahi Chemical Research Laboratory Co., Ltd., Tokyo, Japan

[21] Appl. No.: 940,733

[22] Filed: Dec. 11, 1986

[30] Foreign Application Priority Data

Jan. 14, 1986 [JP] Japan .................................. 61-5643
Jan. 14, 1986 [JP] Japan .................................. 61-5644

[51] Int. Cl.$^4$ .......................... B23F 1/02; B44C 1/22; C03C 15/00; C03C 25/06
[52] U.S. Cl. ......................... 156/630; 29/620; 156/634; 156/656; 156/659.1; 156/902; 338/309; 427/102; 427/103; 427/96
[58] Field of Search .................. 29/610, 620; 427/102, 427/103, 96, 98; 338/308, 309, 314; 156/630, 632, 634, 656, 659.1, 666, 902; 174/68.5

[56] References Cited

U.S. PATENT DOCUMENTS

| | | | |
|---|---|---|---|
| 3,560,256 | 2/1971 | Abrams | 174/68.5 X |
| 3,761,860 | 9/1973 | Ogasawara et al. | 338/309 X |
| 4,496,435 | 1/1985 | Harada et al. | 156/656 X |

Primary Examiner—William A. Powell
Attorney, Agent, or Firm—Robert F. Ziems

[57] ABSTRACT

A method is described for producing multilayer circuits including a resistor circuit on one side of a copper laminated base board, wherein the base board is etched to provide a plurality of circuits of a first layer, effectively processed with a plating-resistant resist and an electrically conductive copper paste to form a plurality of circuits of a second layer, immersed in a metal plating solution to provide a metal plating layer on the copper paste to thereby form the circuits of the second layer on the circuits of the first layer, coated with an electrically conductive paste to provide a pair of electric terminals between two of the circuits of the second layer, and coated with an electrically resistant resist of a predetermined electric resistance value on a part extended between the two electric terminals.

9 Claims, 18 Drawing Figures

METHOD FOR PRODUCING ELECTRIC CIRCUITS ON A BASE BOAD

BACKGROUND OF THE INVENTION

The invention relates to a method for forming electrically conductive circuits on a base board, and more particularly relates to a method for forming a resistor circuit on the base board, wherein a newly developed electrically conductive copper paste, which is specifically adapted to metal plating, is effectively used to form a two-layer circuits of first lower and second upper circuits on one side of the base board, and then a printable resistor paste is used to form a thinnest possible resistor circuit on the second upper circuits.

So far, it has been general to form a resistor circuit on a copper laminated print base board. In this case, a resistor with a lead or a chip-shaped resistor is soldered to a copper lamination circuit. The finished product is therefore bulky in addition to requiring so many processing steps and the resultant high cost including the cost of the resistor. Further according to such a conventional method, the loading density of the print base board is lower, and the reduction of product weight and of production processes is difficult. Moreover since the soldering operation is required, there have often been a misarrangement of leads and a misinsertion of resistors.

Further in the case of forming considerably complex circuits on the copper laminated print base board, it becomes necessary to electrically connect the circuits to each other. However according to the prior art; since it was impossible to form the circuits of more than two layers on one side of the print base board, such circuits were divided and etched on both sides of the base board and electrically connected to each other by the through-holes extended through the thickness of the base board.

Such prior art requires to attach the copper laminations on both sides of the base board, to etch the copper laminations along the designed circuits and to make holes extending through the base board by means of a specific device such as the NC device, and therefore the production cost is increased including the costs of materials and of processing steps, and moreover the production efficiency is low.

In order to improve the conventional method so as to form the electrically conductive circuits of more than two layers on one side of the base board more effectively at a lower cost, it has been required to use an electrically conductive copper paste which is excellent in the electric conductivity and adapted to a metal plating, especially to a copper plating and which is available at a lower cost. Generally the conventional electrically conductive copper paste is easily oxidized with a heat for hardening the paste, in contrast to the precious metal such as silver. The oxidization of copper powder in the paste will increase the electric resistance and decrease the soldering property. These defects have made the conventional electrically conductive paste practically useless. Further it has been required to activate the surface of the hardened electrically conductive copper paste by means of a catalyst so as to expose the copper powder from the resin paste so that the exposed copper powder may act as the binder, that is, so many neucleuses for the subsequent metal plating. Thus the conventional electrically conductive paste has required so many processing steps.

The Japanese utility model application Ser. No. 55-42460 discloses a specific method, in which a high dielectric resist of polybutadiene is used as a dielctric coat, an adhesive paste, for example, of 20% of phenol resin, 63% of copper powder and 17% of solvent is used to form designed circuits, the adhesive paste is thickened up to $20\mu$ by means of a non-electrolytic plating, and then the plated adhesive paste is coated with copper so as to form the electrically conductive circuits of more than two layers on one side of a base board. The mentioned specific method has never been industrially reduced to practice.

The applicant has been engaged in studying new electrically conductive copper pastes for many years to eliminate the defects of the prior art as mentioned above and succeeded to provide such new electrically conductive copper pastes to be industrially employed. The newly developed electrically conductive copper pastes includes the electrically conductive copper paste ACP-020, ACP-030 and ACP-007P of Asahi Chemical Research Laboratory Co., Ltd. The electrically conductive copper paste ACP-020 is substantially composed of 80% by weight of copper powder and 20% by weight of synthetic resin, and is extremely excellent in the electric conductivity, but more or less deteriorated in the soldering property. The electrically conductive copper paste ACP-030 is substantially composed of 85% by weight of copper powder and 15% by weight of synthetic resin, and is slightly lower than the ACP-020 as to the electric conductivity, but excellent in the soldering property. In the last place, the electrically conductive copper paste ACP-007P is an improvement of the ACP-030 and may be subjected to a metal plating such as a copper chemical plating without using a catalyst. Namely the copper paste is extremely excellent in the metal plating property.

OBJECTS OF THE INVENTION

The invention has been provided to eliminate the defects and disadvantages of the prior art. It is therefore an object of the invention to effectively use the newly developed electrically conductive copper paste having the specially excellent metal plating property to form electrically conductive circuits of more than layers on one side of a copper laminated base board, that is, to firstly form a first layer circuit on the copper lamination of the base board, subsequently to coat the mentioned electrically conductive copper paste of excellent metal plating property on the parts of the first layer circuits which are to be connected to a second layer circuits to be formed on the first layer circuits, subsequently to heat the electrically conductive paste to harden the same, subsequently to apply a metal plating on the coated electrically conductive copper paste to increase the electric conductivity of the copper paste up to that of the copper lamination, to thereby form the second layer circuits on the first layer circuits. In this way, a two-layer circuit board is provided having a property substantially equivalent with the conventional both sided and through hole circuit board with the materials and processing steps being reduced almost to a half of the prior art. In fact, the expensive NC drilling machine is not required and the processing method is remarkably simplified compared with the prior art, and accordingly the finished product may be provided at a cost almost a half of the cost required to produce the conventional product.

It is another object of the invention to form a resistor circuit on the second layer circuits, that is, to coat an electrically conductive paste of the excellent electric conductivity property on the parts of the second layer circuits, which are not electrically connected to each other, subsequently to heat the electrically conductive paste to harden the same to thereby form a pair of terminals, subsequently to coat the terminals with a resistor paste of a predetermined resistance value, and then to heat the resistor paste to harden the same to form a resistor circuit on the second layer circuits. In this way, the conventional operation for securing the resistor to the base board is eliminated, and an extremely flat resistor circuit is provided. Moreover the leading density of the base board is increased in addition to the reliability of the finished product which may be of a reduced weight all through the reduced processing steps. Further the finished product may be provided at a reduced cost without misarrangement of leads and misinsertion of the resistor which may often happen in the conventional method.

It is still another object of the invention to modify the mentioned specific method for producing the resistor circuit on a base board to form a plurality of first electrically conductive circuits of a first lamination layer on the base board and at least one second electrically conductive circuit of a second lamination layer on the first electrically conductive circuits, and then to form an electricity storage circuit between the first and second electrically conductive circuits.

SUMMARY OF THE INVENTION

In short, the invention comprises the steps of: attaching a copper lamination to one side of a base board; etching the copper lamination to form thereon a plurality of first electrically conductive circuits of a first lamination layer; coating said one side of the base board with a plating-resistant resist except the portions which are required to be electrically connected to other circuits to be formed on the first electrically conductive circuits of the first lamination layer; coating the first electrically conductive circuit of the first lamination layer with an electrically conductive copper paste of being adapted to a metal plating in a manner that the first electrically conductive circuit of the first lamination layer may be divided into at least two portions to be electrically isolated from each other; heating the base board to harden the base board; cleansing the base board; immersing the base board in a metal plating solution to provide a metal plating layer on the face of the electrically conductive copper paste so as to form second electrically conductive circuits of a second lamination layer which are composed of the metal plating layer and the electrically conductive copper paste; coating an electrically conductive paste on a part of each of the electrically isolated portions of the second electrically conductive circuits of the second lamination layer; heating the base board to harden the electrically conductive paste to form a pair of electric terminals; coating an electrically resistant paste of a predetermined resistance value on a part extending between the two electric terminals; and heating the base board to harden the electrically resistant paste to form a resistor circuit between the two electrically isolated portions of the second electrically conductive circuits of the second lamination layer.

Further another aspect of the invention comprises the steps of: attaching a copper lamination to one side of a base board; etching the copper lamination to form thereon a plurality of first electrically conductive circuits of a first lamination layer; coating said one side of the base board with a plating-resistant resist except the portions which are required to be electrically connected to another circuit to be formed on the first electrically conductive circuits of the first lamination layer; coating an electrically conductive copper paste of being adapted to a metal plating on one side of the base board in a manner that at least two of the first electrically conductive circuits may be electrically connected; heating the base board to harden the base board; cleansing the base board; immersing the base board in a metal plating solution to provide a metal plating layer on the face of the electrically conductive paste so as to form at least one second electrically conductive circuit of a second lamination layer which is composed of the metal plating layer and the electrically conductive copper paste; coating a dielectric paste having a property of storing electricity on the remain of the first electrically conductive circuits remained without the electrically conductive copper paste coated thereon or on a part of the second electrically conductive circuit; heating the base board to harden the dielectric paste; coating said one side of the base board with an electrically conductive paste in a manner that the electrically conductive paste will extend between the dielectric paste and one of said first electrically conductive circuits, or the second electrically conductive circuit; and heating the base board to harden the electrically conductive paste to thereby form an electricity storing circuit on the base board.

BRIEF DESCRIPTION OF THE DRAWINGS:

FIGS. 1 through 9 relate to a first embodiment of the invention, in which:

FIG. 1 shows a copper laminated base board in vertical section;

FIG. 2 shows an etching resistant resist coated on the base board in FIG. 1;

FIG. 3 shows first electrically conductive circuits formed by etching on the base board in FIG. 2;

FIG. 4 shows a plating resistant resist coated on the base board in FIG. 3;

FIG. 5 shows an electrically conductive copper paste coated on the base board in FIG. 4;

FIG. 6 shows second electrically conductive circuits formed by non-electrolytic plating on the base board in FIG. 5;

FIG. 7 shows electric terminals formed with an electrically conductive paste on the base board in FIG. 6;

FIG. 8 shows a resistor circuit with an resistor paste on the base board in FIG. 7; and FIG. 9 shows an overcoat covered all over the face of the base board to finish the processing steps of the base board.

FIGS. 10 through 18 relate to a second embodiment of the invention, in which:

FIG. 10 shows a copper laminated base board invertial section;

FIG. 11 shows an etching resistant resist coated on the base board in FIG. 1;

FIG. 12 shows first electrically conductive circuits formed by etching on the base board in FIG. 11;

FIG. 13 shows a plating resistant resist coated on the base board in FIG. 12;

FIG. 14 shows an electrically conductive copper paste coated on the base board in FIG. 13;

FIG. 15 shows a second electrically conductive circuit formed by a copper chemical plating on the base board in FIG. 14;

FIG. 16 shows a dilectric paste coated on the base board in FIG. 15;

FIG. 17 shows an electrically conductive paste coated on the base board in FIG. 16 to form an electrically storing circuit thereon; and FIG. 18 shows an overcoat covered all over the face of the base board in FIG. 17 to finish the processing steps of the base board.

Figure 1:
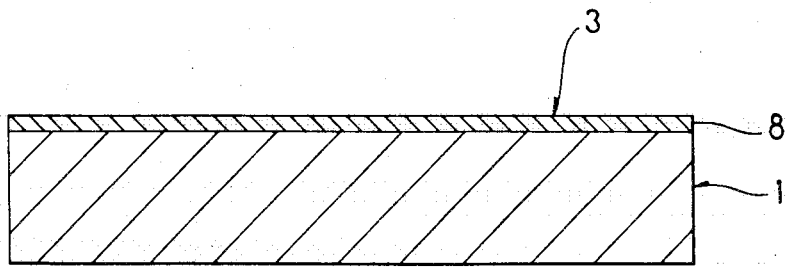
Figure 2:
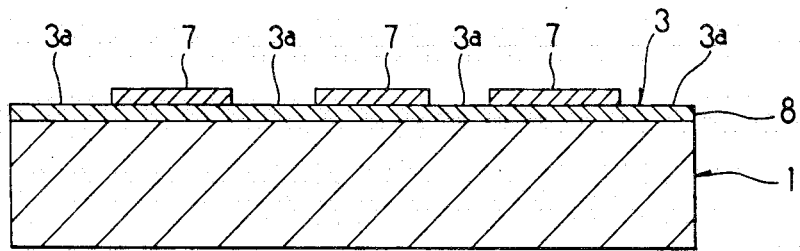
Figure 3:
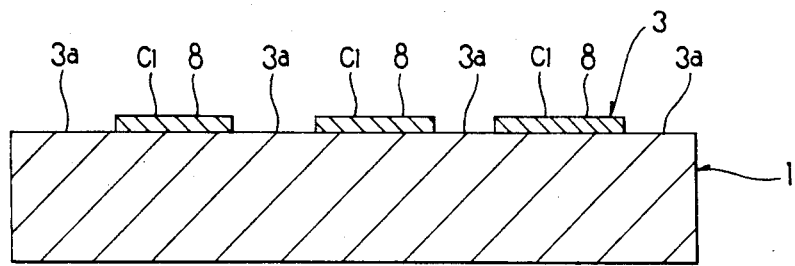
Figure 4:
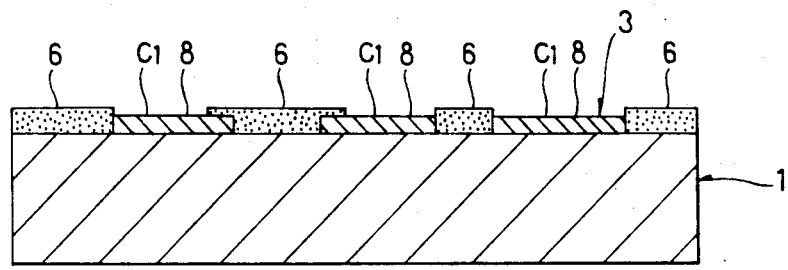

DETAILED DESCRIPTION OF THE INVENTION:

Now in reference to FIG. 1, a base board 1, which is for example made of a polymer, has a copper lamination 8 attached to one side thereof and is formed as a copper laminated base board 3. An etching resistant resist 7 is coated on the copper lamination 8 except the portions $3a$ where no first electrically conductive circuits $C_1$ are formed as shown in FIG. 3, and then is heated to be hardened. The etching resistant resist 7 is etched to form a plurality of first electrically conductive circuits $C_1$ of a first lamination layer of the copper lamination 8 which is eliminated at the portions $30a$ as shown in FIG. 3. Then as shows in FIG. 4, a plating resistant resist 6, such as the resist CR-2001 developed by Asahi Chemical Research Laboratory Co., Ltd. is coated on the base board 1 except the portions of the first electrically conductive circuits $C_1$ which are required to be electrically connected to the other circuits such as second electrically conductive circuits $C_2$ to be formed on the first electrically conductive circuits (shown in FIG. 6). Then the base board 3 is heated at the temperature of about 150° C. for about 30 minutes to harden the plating resistant resist 6.

Figure 5:
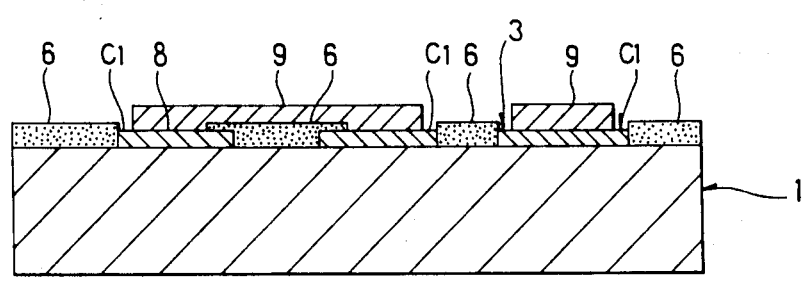

Subsequently an electrically conductive copper paste 9, such as the paste ACP-007P developed by Asashi Chemical Research Laboratory Co., Ltd., which is specifically adapted to a plating is coated by way of screen printing on the first electrically conductive circuits $C_1$ in a manner that the circuits will be divided into at least two portions to be electrically isolated from each other as shown in FIG. 5, and then is heated at the temperature of about 150° C. for 30 to 60 minutes so as to be hardened.

Subsequently the copper laminated base board 3 is subjected to a treatment in preparation to the next plating process. Namely the base board 3 is cleansed with a water solution including 4–5% by weight of caustic soda (NaOH) for about several minutes, and then the face treatment is made with a water solution including 5–10% by weight of hydrochloric acid (HCl) for about several minutes. As the result, the copper powder particles are exposed from the binder of the electrically conductive copper paste 9, thus providing the neucleuses for the next copper plating treatment. In this case, it is noted that a catalyst is not needed which may be required in the case of non-electrolytic plating.

Figure 6:
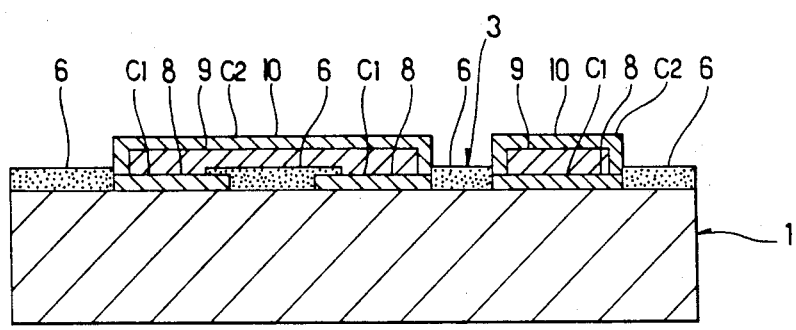

Subsequently the copper laminated base board 3 is immersed in a copper chemical plating both to apply the copper chemical plating to the face of the electrically conductive copper paste 9 to thereby form thereon a copper plating layer 10 as shown in FIG. 6. As the result, there are formed second electrically conductive circuits $C_2$ of a second lamination layer, which are electrically connected to the first electrically conductive circuits $C_1$ of the first lamination layer. The copper chemical plating bath is of pH 11–13 and of the temperature 65°–75° C., and the thickness of the copper plating layer is more than 5 μm, and further the plating accumulation speed is about 1.5–3 μm per hour.

Figure 7:
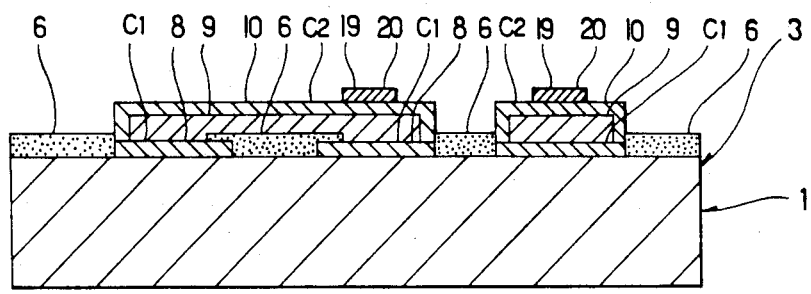
Figure 8:
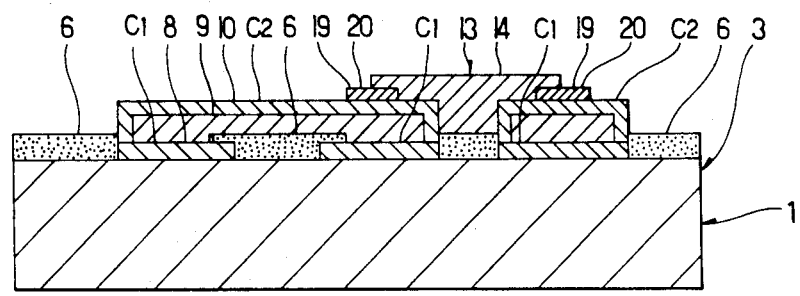

Thus the second electrically conductive circuits $C_2$ are formed on one side of the copper laminated base board 3 by the electrically conductive copper paste 9 and the copper plating layer 10. Subsequently as shown in FIG. 7, an electrically conductive paste 19 such as a silver paste is coated on the electrically isolated portions of the second electrically conductive circuits to form thereon a pair of electric terminals 20, and then is heated to be hardened. Subsequently as shown in FIG. 8, an electrically resistant paste 14 of a predetermined resistance value is coated on the portion extending between the two terminals 20 of the second electrically conductive circuits $C_2$ and is heated to be hardened. Thus a resistor circuit 13 is formed between the electrically isolated portions of the second electrically conductive circuits $C_2$.

Figure 9:
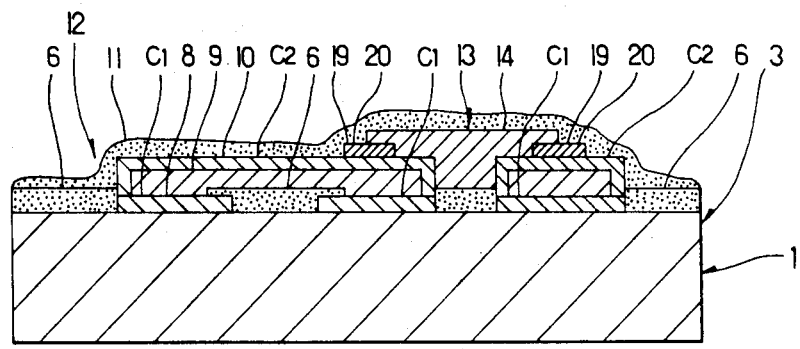

Finally as shown in FIG. 9, an overcoat 11 such as a plating resistant CR-2001 developed by Asahi Chemical Research Laboratory Co., Ltd. is coated all over the so processed side of the copper laminated base board 3, and then is heated to be hardened. Thus a print circuit base board 12 is finished up.

According to the invention, the metal plating applied to the electrically conductive copper paste 9 may be a precious metal plating such as a silver or gold plating instead of the mentioned copper plating. Further the first and second electrically conductive circuits $C_1$, $C_2$ may be formed on the overcoat 11 which is coated on one side of the base plate 1 instead of the copper lamination 8. In the mentioned way, the circuits of more than 3 layers may be formed on one side of the base board in accordance with the present invention.

Further it would be necessary to briefly explain the electrically conductive copper paste, an electrically resistant paste and the plating resistant paste which are used in this invention:

As to the paste ACP-007P developed by Asahi Chemical Research Laboratory Co., Ltd. by way of example for an electrically conductive copper paste which is specifically adapted to a copper plating, it is generally known that copper is easily oxidized, and more especially copper in the condition of powder particles may be more easily oxidized because the exposed outer surface is enlarged. In contrast to the non-oxidizable paste of precious metals, it becomes necessary to provide a paste of such ingredients as to remove the oxidized film of the copper powder particles and also to prevent the reoxidization of the copper particles. In order to provide an electrically conductive copper paste which may be easily used and easily secured to a base material, it is important to properly select and easily secured to a base material, it is important to properly select and properly mix the ingredients such as copper powder, binder, special additive (for example, anthracene, anthracene carboxylic acid, anthradine, anthranilic acid), dispersant and solvent.

The copper particles are different in the configuration thereof depending upon the production method thereof. In the electrolytic method, the copper particles are deposited in high purity and also in branched shapes. In the reduction method wherein the oxides are reduced by a reducing gas, the copper particles are provided in spongy and porous shapes.

The electrically conductive copper paste to be used in connnection with this invention is required to have the following properties:

1. To be easily coated by way of screen printing in formation of fine patterns.
2. Fixedly secured to the base board.
3. To be resistant against a high temperature alkali bath of copper chemical plating.
4. Fixedly secured to the copper plating.
5. Having an invariable viscosity in the elapse of time to maintain a stabilized printability.

In order to satisfy the above mentioned requirements the electrically conductive copper paste is required to contain the copper particles of high purity in the branch shapes as deposited by the electrolysis and/or the copper particles of porous spongy shapes as reduced from the metal oxides. The copper particles may be processed into flakes.

Further in order to highten the content rate of the copper particles in the paste, it is required to fill the copper particles of different sizes and shapes to a maximum density.

As to the binder of the electrically conductive copper paste, the binder is required to act as a vehicle for so much copper particles and as an effective adhesive to the base board. Further the binder must resist against the alkali bath of a copper chemical plating.

It was found that the electrically conductive copper paste was best when the copper paste contained the epoxy resin which has a larger content rate of copper particles and hightens the deposition rate of the plating, and further increases the adhesive property of the plating film.

With respect to the property of the copper plating deposited on the electrically conductive copper paste ACP-007P, the copper plating is reddish brown and paste-like and has a viscosity of 300-500 ps at the temperature of 25° C. The adhesive property to a copper laminated base board and to a resin base board has been confirmed by a taping test. Further the adhesive property to the electrically conductive paste has been confirmed by the taping test. The soldering property is more than 96% as to the extension rate and is more than 3.0 kg as to the tensile force ($3 \times 3$ mm$^2$).

The components of the electrically conductive copper paste and the conductivity thereof are mentioned in detail in the same applicant's Japanese patent applications 55-6609 (laid open: 56-103260) (corresponding U.S. Pat. No. 4,353,816) and 60-216041 (corresponding U.S. Pat. application of Ser. No. 06/895716), and therefore the description thereof is omitted herein.

With respect to the electrically resistant paste, the paste contains a refined powder of carbon or graphite or the like of high purity as an electrically conductive element and a heat hardened resin such as epoxy resin, phenol resin, melamine resin, acrylic resin or the like as a binder, and further contains, as a viscosity modifier, a solvent which is evaporated slowly at a high temperature.

The components of the electrically resistant paste are each required to have a specific property. For example, as the functional powder, the particles must be fine and uniform and further of high purity as well as high quality. Further the particles must be of little difference in the electric resistance value and must be familiar with the resin to be mixed therewith.

As to the property of polymer, it is preferable that the paste is easily dissolved with the particles and will not be filmy if placed for a long time in a normal temperature. The paste further is required to be not hardened at a normal temperature and to be quickly hardened when heated. The hardened paste must not be vary in volume and must be slightly flexible and further easily adhesive to the base board. Further the paste must be resistant against heat and humidity, and also must be easily adhesive to the undercoat as well as to the overcoat.

As to the property of solvent, the paste is required to be stabilized in the successive printing operations, that is, not to fill the prints and not be deteriorate the emulsion film. The paste is further required to be slow in the evaporation speed at a normal temperature and reluctant to absorb water, not to abruptly change the viscosity thereof at the temperatures $\pm 10°$ C. and to have no poison and or irritating smell at a normal temperature and in the vapor at the time of heating.

The electrically resistant paste such as the paste TU-1K has been developed by Asahi Chemical Research Laboratory Co., Ltd. so as to fully satisfy the requirements as mentioned above. The electrically resistant paste maintains very stabilized resistance, that is, the resistance variation rate is only about 0.5% at the soldering temperatures at 240° C. and 260° C. Further the paste will not abruptly absorb the heat and will not respond to the heat until the soldering temperature is reached as actually indicated by a heat difference analysis curve, and therefore the volume variation of the resistor is extremely small.

With respect to the plating resistant resist such as the resist CR-2001 developed by Asahi Chemical Research Laboratory Co., Ltd. so as to be used in the present invention, this resist is coated on a first circuit which is not electrically connected to a second circuit which is to be formed on the first circuit. Therefore the resist is required to have an isolating property and at the same time an alkali resistant property. Actually the resist has been developed to maintain the acidity more than 4 hours in the alkali bath of 70° C. and of pH12 just like the copper chemical plating bath.

Similar to the electrically conductive copper paste ACP-007P, the resist contains as a main component an epoxy resin and is printed through a 180-mesh polyester screen and then is heated for 30 minutes at the temperature 150° so as to be hardened. The printing film is preferably 15-30 $\mu$m so as to resist chemicals and voltages. The main features are as follows: The resist is easily adhered to the base on which the resist is coated, and to a copper lamination and further is not deteriorated is immersed in the alkali bath of pH12 for a long time. The resist is quite safe in the practical use because the hardener to be used is alkali having little poison. The resist is coated by way of screen printing and has a hardener 10 g mixed with the principal component 100 g thereof, and is hardened in a set time 15-30 minutes at the temperature 150°-200° C.

The plating resistant resist is green in the condition of ink and has an adhesion (cross-cut) 100/100 on a copper lamination, a surface hardness of more than 8H when measured by a pencil, a solvent resistant property (in trichloroethylene) by more than 15 sec., a soldering heat (260° C.) resistant property of more than 5 cycles, a surface isolation resistance value of more than $5 \times 10^{13} \Omega$, a volume resistance value of $1 \times 10^{14} \Omega$-cm, a voltage (15 $\mu$m) resistant property of more than 3.5 kV and a dielectric tangent (1 MHz) of less than 0.03.

The embodiment of the invention as mentioned above may be modified into another embodiment in which the base board has an electricity storing circuit is formed thereon in place of the resistor circuit.

Figure 10:
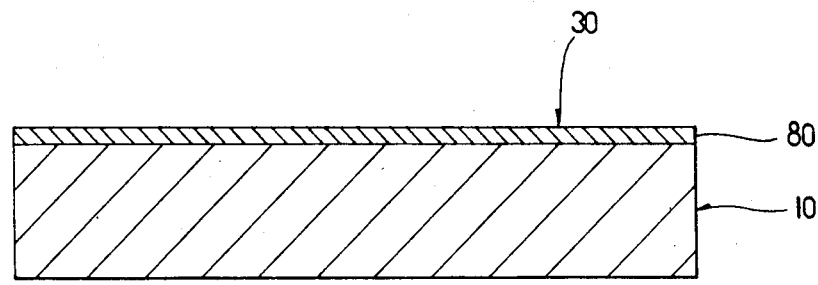

Now in reference to FIG. 10, a polymer base board 10A has a copper lamination 80 attached on side thereof, and thus a copper laminated base board 30 is provided.

Figure 11:
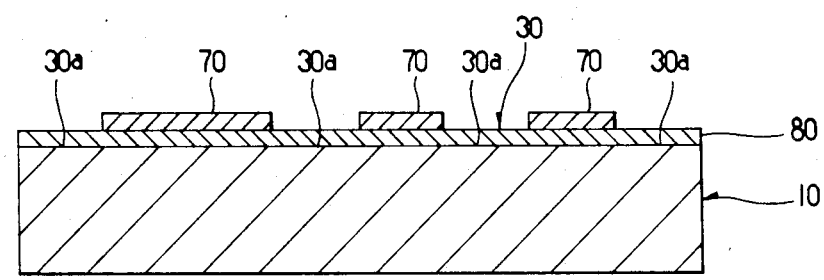
Figure 12:
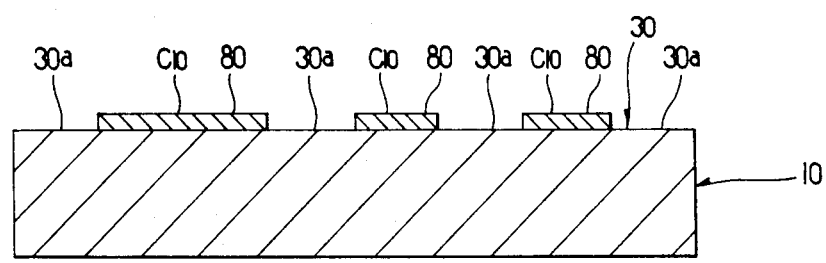

In reference to FIGS. 11 and 12, an etching resistant resist 70 is coated on the copper lamination 80 except the portions 30a where there are formed no first electrically conductive circuits $C_{10}$, and then the base board 30 is heated to be hardened. Subsequently the base board 30 is etched to form thereon a plurality of first electrically conductive circuits $C_{10}$ of a first lamination layer of the copper lamination 80 which is eliminated at the portions 30a.

Figure 13:
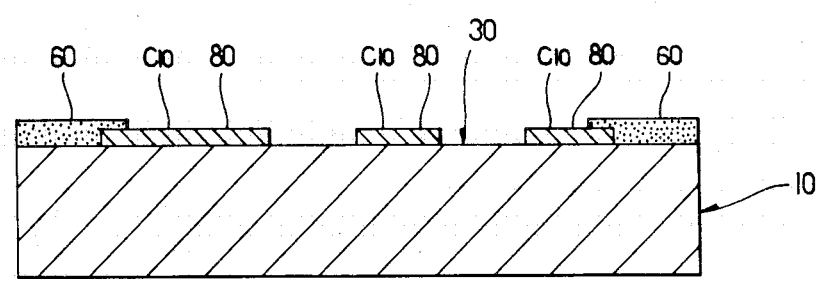
Figure 14:
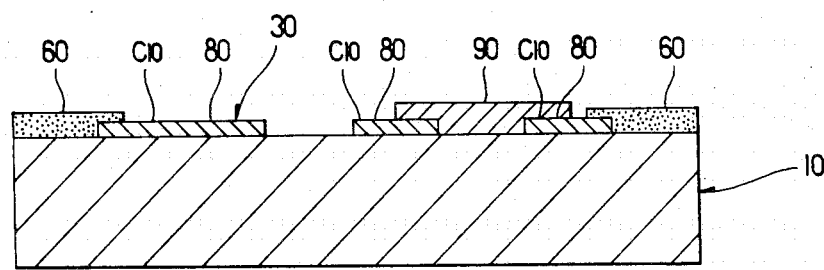
Figure 15:
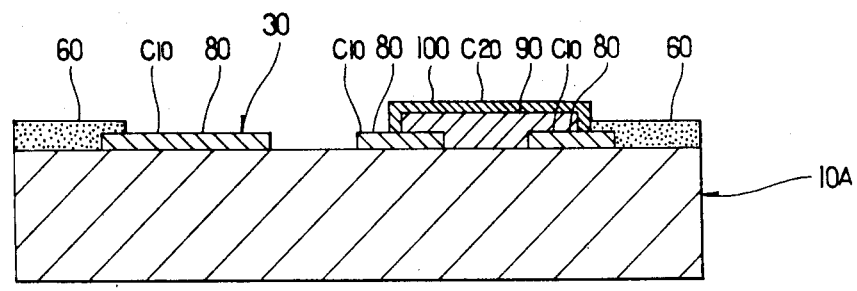
Figure 16:
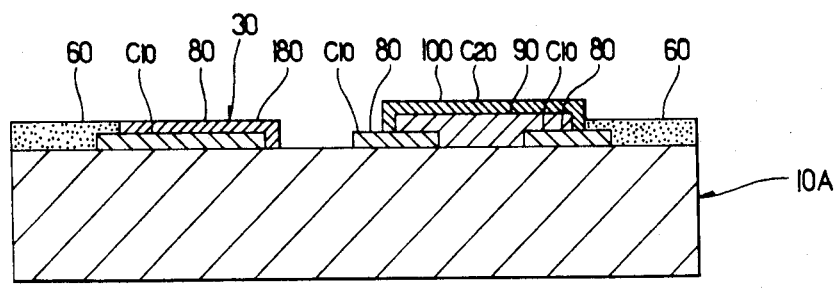

Subsequently in reference to FIGS. 13 and 14, a plating resistant resist 60 such as the resist CR-2001 developed by Asahi Chemical Research Co., Ltd., is coated on the base board 10 except to portions of the first electrically conductive circuits $C_{10}$ which are required to be electrically connected to another circuit such as a second electrically conductive circuit $C_{20}$ as shown in FIG. 15 which are to be formed on the first electrically conductive circuits $C_{10}$, and then the base board 30 is heated at the temperature of about 150° C. for about 30 minutes to harden the plating resistant resist 60.

Subsequently an electrically conductive copper paste 90 such as the electrically conductive copper paste ACP-007P developed by Asahi Chemical Research Laboratory Co., Ltd., is coated by way of screen printing on the base board 30 in a manner that at least two of the first electrically conductive circuits $C_{10}$ are electrically connected to each other, and then the base board 30 is heated at the temperature of about 150° C. for 30–60 minutes to harden the paste 90.

In this condition, the base board 30 is subjected to a treatment in preparation to the next plating process. Namely the base board 30 is cleansed with a water solution containing 4–5% by weight of caustic soda (NaOH) for about several minuted, and then the face treatment is made with a water solution containing 5–10% by weight of hydrochloric acid (HCl) for about several minutes. As the result, the copper powder particles are exposed from the binder of the electrically conductive copper paste 90, thus providing the nucleuses for the next copper plating treatment. In this case, it is noted that a catalyst is not needed which may be required in the case of non-electrolytic plating.

Subsequently the base board 30 is immersed in a copper chemical plating both to apply the copper plating to the face of the electrically conductive copper paste 90 to thereby form thereon a copper plating layer 100 as shown in FIG. 15. Thus a second electrically conductive circuit $C_{20}$ of a second lamination layer is formed on the two first electrically conductive circuits $C_{10}$ in a manner that the second circuit $C_{20}$ is electrically connected to the two first circuits $C_{10}$. The copper chemical plating bath is of pH11-13 and of the temperature 65°–75° C., and the thickness of the copper plating layer is more than 5 μm, and further the plating accumulation speed is about 1.5–3 μm per hour.

Figure 17:
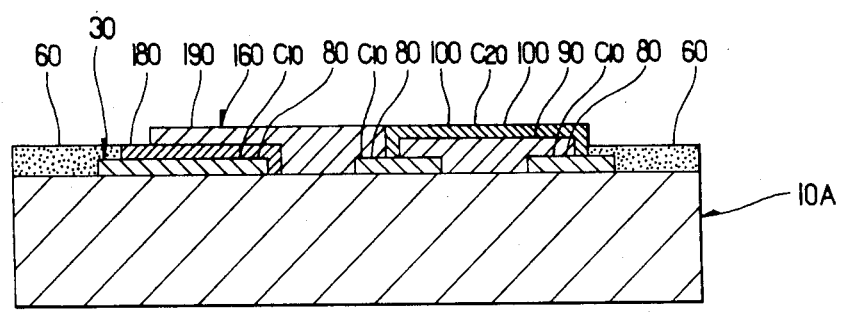

Subsequently as shown in FIGS. 10 and 17, a dielectric paste 180, which has a property of storing electricity, is coated on the first electrically conductive circuit $C_{10}$ which has remained without the electrically conductive copper paste 90 being coated thereon, and then the base board 30 is heated to harden the dielectric paste. Then an electrically conductive paste 190 such as a silver paste is coated on a range extending between the second circuit $C_{20}$ and the first circuit $C_{10}$ having the dielectric paste 180 coated thereon, in a manner that the paste 180 will be electrically connected to the second circuit $C_{20}$ and to the first circuit $C_{10}$, and then the base board 30 is heated to harden the electrically conductive paste 190, to thereby form an electricity storing circuit 160 between the first electrically conductive circuit $C_{10}$ of the first lamination layer and the second electrically conductive of the second lamination layer on one side of the copper laminated base board 30.

Figure 18:
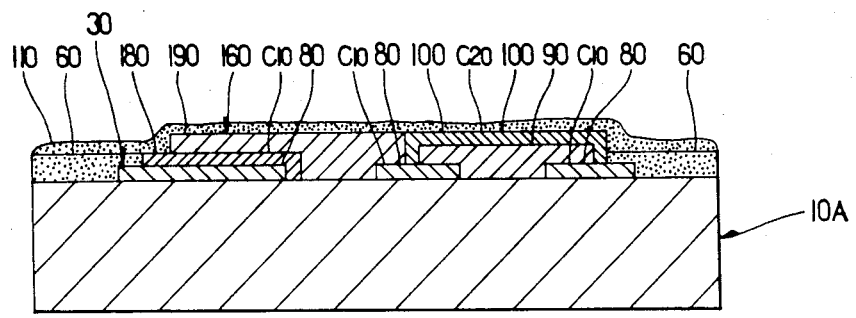

Finally as shown in FIG. 18 an overcoat 110 such as the plating resistant resist CR-2001 developed by Asahi Chemical Research Laboratory Co., Ltd., is coated on one side of the base board 30 to cover the first electric conductive circuits $C_{10}$, the second electrically conductive circuit $C_{20}$ and the electricity storing circuit 160, and then is heated at the temperature of about 150° C. for about 30 minutes to harden the overcoat 110. Thus the multilayer circuits of the first and second circuits and of the electricity storing circuit are easily formed on one side of the base board by way of a proper combination of the substractive method and the additive method of the invention as mentioned.

Further it is apparent that an additional circuit or circuits may be formed on the overcoat 110 in FIG. 18 to more increase the accumulation of the circuits on one side of the base board.

Other modifications and variations may be obvious to those skilled in the art without departing from the spirit and scope of the invention, and all such modifications and variations will be included within the scope of the following claims.

What is claimed is:

1. A method for forming electric circuits on a base board comprising the steps of:
    (a) attaching a copper lamination to one side of the base board;
    (b) etching copper lamination to form thereon a plurality of first electrically conductive circuits of a first lamination layer;
    (c) coating said one side of the base board with a plating-resistant resist except the portions which are required to be electrically connected to other circuits to be formed on the first electrically conductive circuits of the first lamination layer;
    (d) coating an electrically conductive copper paste of being adapted to a metal plating on said one side of the base board in a manner that the first electrically conductive circuits of the first lamination layer may be divided into at least two portions to be electrically isolated from each other;
    (e) heating the base board to harden the so processed base board;
    (f) cleansing the base board;
    (g) immersing the base board in a metal plating solution to provide a metal plating layer on the face of the electrically conductive copper paste so as to form second electrically conductive circuits of at least two electrically isolated portions of a second lamination layer which are composed of the metal plating layer and the electrically conductive copper paste;
    (h) coating an electrically conductive paste on a part of each of the electrically isolated portions of the second electrically conductive circuits of the second lamination layer;

(i) heating the base board to harden the electrically conductive paste to form a pair of electric terminals;

(j) coating an electrically resistant paste of a predetermined resistance value on a part extending between the two electric terminals; and (k) heating the base board to harden the electrically resistant paste to form a resistor circuit between the two electrically isolated portions of the second electrically conductive circuits of the second lamination layer.

2. The method as defined in claim 1, wherein the base board is made of polymer.

3. The method as defined in claim 1, wherein metal plating is a chemical copper plating.

4. The method as defined in claim 1, wherein one of said at least two electrically isolated portions of the first electrically conductive circuits includes at least two circuits electrically connected to each other, and the other of said at least two electrically isolated portions of the first electrically conductive circuits includes at least one circuit.

5. The method as defined in claim 1, wherein one of said at least two electrically isolated portions of the second electrically conductive circuits includes at least two circuits electrically connected to each other, and the other of said at least two electrically isolated portions of the second electrically conductive circuits includes at least one circuit.

6. A method for forming electric circuits on a base board comprising the steps of:

(a) attaching a copper lamination to one side of the base board;

(b) etching the copper lamination to form thereon a plurality of first electrically conductive circuits of a first lamination layer;

(c) coating said one side of the base board with a plating-resistant resist except the portions which are required to be electrically connected to another circuit to be formed on the first electrically conductive circuits of the first lamination layer;

(d) coating an electrically conductive copper paste of being adapted to a metal plating on said one side of the base board in a manner that at least two of the first electrically conductive circuits may be electrically connected;

(e) heating the base board to harden the base board;

(f) cleansing the base board;

(g) immersing the base board in a metal plating solution to provide a metal plating layer on the face of the electrically conductive paste so as to form at least one second electrically conductive circuit of a second lamination layer which is composed of the metal plating layer and the electrically conductive copper paste;

(h) coating a dielectric paste having a property of storing electricity on the remain of the first electrically conductive circuits remained without the electrically conductive copper past coated thereon or on a part of the second electrically conductive circuit;

(i) heating the base board to harden the dielectric paste;

(j) coating said one side of the base board with an electrically conductive paste in a manner that the electrically conductive paste will extend between the dielectric paste and one of the first electrically conductive circuits, or said second electrically conductive circuit; and (k) heating the base board to harden the electrically conductive paste to thereby form an electricity storing circuit on the base board.

7. The method as defined in claim 6, wherein the base board is made of polymer.

8. The method as defined in claim 6, wherein the metal plating is a chemical copper plating.

9. The method as defined in claim 6, wherein said other of the first electrically conductive circuits includes at least one circuit.

* * * * *